(12) United States Patent
Lee et al.

(10) Patent No.: US 9,759,564 B2
(45) Date of Patent: Sep. 12, 2017

(54) TEMPERATURE AND POWER SUPPLY CALIBRATION

(71) Applicant: Fairchild Semiconductor Corporation, San Jose, CA (US)

(72) Inventors: Shungneng Lee, Sunnyvale, CA (US); Justin Seng, San Jose, CA (US); Marwan Ashkar, Cupertino, CA (US); Ion Opris, San Jose, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 651 days.

(21) Appl. No.: 14/217,863

(22) Filed: Mar. 18, 2014

(65) Prior Publication Data

US 2014/0269813 A1   Sep. 18, 2014

Related U.S. Application Data

(60) Provisional application No. 61/798,517, filed on Mar. 15, 2013.

(51) Int. Cl.
| | | |
|---|---|---|
| *G01K 15/00* | (2006.01) | |
| *G01C 19/5776* | (2012.01) | |
| *B81B 7/00* | (2006.01) | |
| *H03L 7/087* | (2006.01) | |
| *H03L 7/093* | (2006.01) | |
| *H03L 7/099* | (2006.01) | |

(52) U.S. Cl.
CPC .......... *G01C 19/5776* (2013.01); *B81B 7/008* (2013.01); *H03L 7/087* (2013.01); *H03L 7/093* (2013.01); *H03L 7/099* (2013.01)

(58) Field of Classification Search
USPC ............................... 374/1, E15.001, 152, 170
See application file for complete search history.

(56) References Cited

U.S. PATENT DOCUMENTS

| | | | | |
|---|---|---|---|---|
| 5,818,225 A | * | 10/1998 | Miekley | ................ G01D 3/036 |
| | | | | 324/225 |
| 7,649,373 B2 | * | 1/2010 | Tokunaga | ........ G01R 19/16552 |
| | | | | 324/750.3 |
| 7,999,554 B2 | * | 8/2011 | Bucur | ................ H01M 2/1016 |
| | | | | 320/112 |
| 2011/0200212 A1 | * | 8/2011 | Wismar | ................ H02M 3/073 |
| | | | | 381/174 |
| 2013/0099836 A1 | | 4/2013 | Shaeffer et al. | |

OTHER PUBLICATIONS

Sebastiano, Fabio, et al., "A 1.2-V 10-μW NPN-Based Temperature Sensor in 65-nm CMOS With an Inaccuracy of 0.2° C. (3σ) From −70° C. to 125° C.", IEEE Journal of Solid-State Circuits, vol. 45, No. 12, Dec. 2010, (Dec. 1, 2010), 2591-2601.

* cited by examiner

*Primary Examiner* — Lisa Caputo
*Assistant Examiner* — Nasir U Ahmed
(74) *Attorney, Agent, or Firm* — Brake Hughes Bellermann LLP

(57) ABSTRACT

This document discusses, among other things, a temperature and power supply calibration system configured to compensate for temperature and supply voltage variation in MEMS or other circuits using representations of positive and negative supply voltages and first and second base-emitter voltages, wherein the second base-emitter voltage is a scaled representation of the first base-emitter voltage.

20 Claims, 2 Drawing Sheets

TEMPERATURE AND POWER SUPPLY CALIBRATION

CLAIM OF PRIORITY

This application claims the benefit of priority under 35 U.S.C. §119(e) of U.S. Provisional Patent Application Ser. No. 61/798,517, titled "PLL-based Demodulation Method for a MEMS Gyroscope," filed on Mar. 15, 2013, which is incorporated by reference herein in its entirety.

BACKGROUND

In certain examples, circuit performance or output can be affected by various external conditions, such as changes in operating temperature. In response, various solutions have been developed, including, for example, temperature sensors configured to provide temperature, in certain examples, allowing for calibration of the circuit to the specific determined operating temperature.

OVERVIEW

This document discusses, among other things, a temperature and power supply calibration system configured to compensate for temperature and supply voltage variation in MEMS or other circuits using representations of positive and negative supply voltages and first and second base-emitter voltages, wherein the second base-emitter voltage is a scaled representation of the first base-emitter voltage.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Microelectromechanical systems (MEMS) include small mechanical devices, fabricated using semiconductor fabrication techniques, that perform electrical and mechanical functions, sensitive to, among other things, motion, acceleration, or orientation in various forms. Examples of MEMS sensors include, among other things, accelerometers, gyroscopes, magnetometers, etc. MEMS, due to their size and mechanical nature, can be sensitive to, among other things, even minor variations in temperature or supply voltage.

The present inventors have recognized, among other things, systems and methods for calibrating sensors or circuits, MEMS or otherwise, for variation in supply voltage, reducing the sensitivity of the sensor or circuit to changes in supply voltage during operation. For example, a difference between a positive and negative supply, or a change (Δ) in said differences can be determined and subsequently used to compensate the output of the sensor or circuit.

Figure 1:
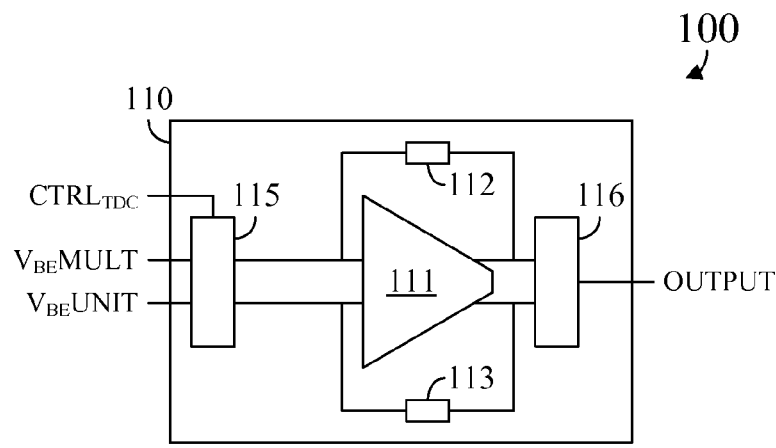
FIG. 1 illustrates generally a system including a temperature-to-digital converter (TDC) configured to determine a temperature using a ratio of base-emitter voltage ($V_{BE}$).

Many existing sensors and circuits (e.g., MEMS sensors, etc.) include a temperature sensor to sense temperature information and compensate for variation in an output signal due to temperature. For example, FIG. 1 illustrates generally a system 100 including a temperature-to-digital converter (TDC) 110 configured to determine temperature information using, at least in part, first and second base-emitter voltages ($V_{BE}$). Because $V_{BE}$ of a transistor varies with temperature, a ratio of $V_{BE}$ can be used to provide temperature information. The ratio can be accomplished using transistors with scaled current densities, multiple transistors in parallel, etc. In operation, actual temperature can be determined using a ratio of a proportional to absolute temperature (PTAT) change in $V_{BE}$ to a temperature flat bandgap voltage. The determined temperature information can be used to reduce the temperature coefficient of the associated sensor or circuit.

The TDC 110 can be configured to receive a single unit of $V_{BE}$ ($V_{BE}$UNIT) at a first input and a multiple unit of $V_{BE}$ ($V_{BE}$MULT) (e.g., 10×$V_{BE}$UNIT, etc.) at a second input, to determine a differential output using a differential amplifier 111, and to provide a digital output signal representative of the difference using an output circuit 116. In certain examples, the TDC 110 can include feedback circuits 112, 113, a TDC conditioning circuit 115 including, for example, one or more resistors, capacitors, switches, or one or more other desired circuits or components configured to condition the signals provided to the differential amplifier 111. In an example, the TDC conditioning circuit 115 can be controlled using a control signal ($CTRL_{TDC}$), in certain examples, including a clock signal, etc. In certain examples, when a digital output is desired, the output circuit 116 can include an analog-to-digital converter (ADC). In other examples, the output circuit 116 can be configured to provide an analog output representative of the difference between the first and second inputs.

The present inventors have recognized that, in certain examples, a combined temperature and supply voltage sensor can be realized using a single differential amplifier circuit, receiving both temperature information and supply voltage information. In certain examples, an existing temperature sensor can be modified to detect both temperature information and supply voltage information.

In an example, an uncalibrated sensor can provide an uncorrected output X. Many error coefficients, such as temperature or supply voltage information, can be corrected using a linear correction factor, e.g., Y=m*X+b, where m is the scale and b is the offset. In an example, both offset and scale can be corrected using the techniques disclosed herein. In other examples, other higher-order correction techniques can be used to provide a compensated output.

In an example, the differential amplifier circuit can continue to receive temperature information while receiving supply voltage information. In other examples, the differential amplifier circuit can receive temperature information at a first time and supply voltage information at a second, different time, using, for example, different control signals and one or more switches. In an example, as a bandgap voltage can be developed as a function of $V_{BE}$, the supply voltage can be detected as, for example, a ratio of a bandgap voltage, without the use of a separate traditional analog bandgap voltage reference.

Figure 2:
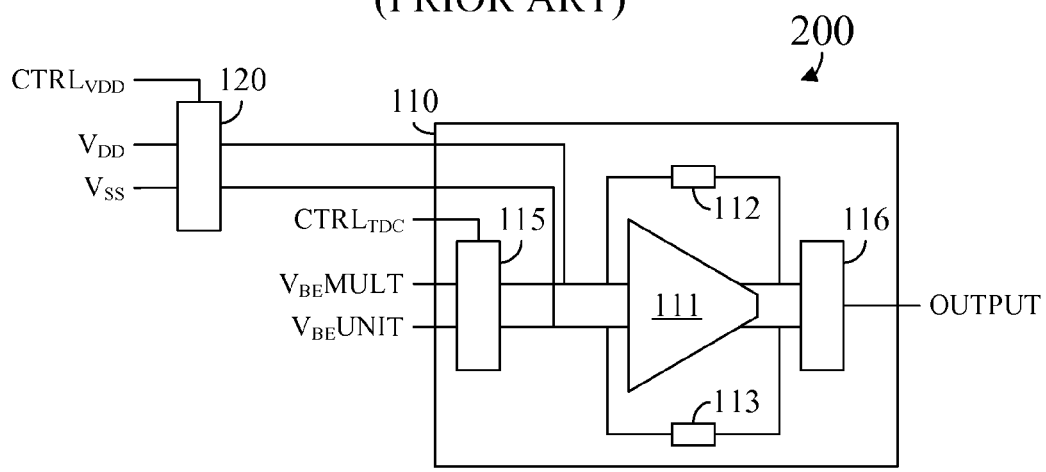
FIG. 2 illustrates generally an example sensor configured to sense both temperature and supply voltage information.

FIG. 2 illustrates generally an example sensor 200 configured to sense both temperature and supply voltage information, the sensor 200 including a differential amplifier 111 similar to that illustrated in the example of FIG. 1. The supply voltage sensor 200 can include a supply voltage conditioning circuit 120 including, for example, one or more capacitors, switches, or one or more other desired circuits, and can be configured to receive a positive supply voltage ($V_{DD}$) at a first input and a negative supply voltage ($V_{SS}$) at a second input. In an example, the sensor 200 can be configured to receive $V_{DD}$ and $V_{SS}$ as well as $V_{BE}$UNIT and $V_{BE}$MULT. In an example, the supply voltage conditioning circuit 120 can be controlled using a control signal (CTRL$_{VDD}$), in certain examples, including a clock signal, etc.

Depending on the desired output, the output circuit 116 can include one or more memory circuits (e.g., registers, flip-flops, non-transitory computer-readable storage media, etc.) or one or more other circuits configured to condition the output of the sensor 200 to provide desired output information. One example of such output is described, for example, in FIG. 4.

As illustrated in FIG. 2, the components of an existing temperature circuit, such as that illustrated in the example of FIG. 1, can be modified to provide the combined temperature and supply voltage sensor, for example, without requiring a traditional bandgap voltage reference, as a bandgap voltage can be estimated using $V_{BE}$ and $\Delta V_{BE}$ of the temperature sensor.

Figure 3:
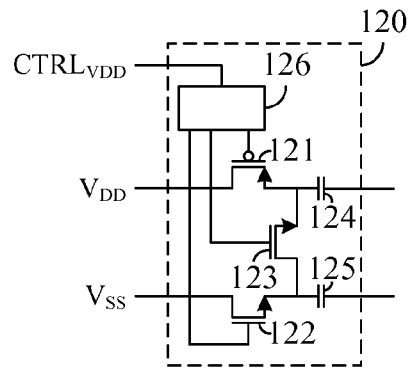
FIG. 3 illustrates generally an example supply voltage conditioning circuit.

FIG. 3 illustrates generally an example supply voltage conditioning circuit 120 including, for example, first, second, and third transistors 121, 122, 123, first and second capacitors 124, 125, and a control circuit 126. The first and second transistors 121, 122 are configured to receive $V_{DD}$ and $V_{SS}$, respectively, and the control circuit 126 is configured to receive CTRL$_{TDC}$. In an example, using the control circuit 126, the first and second transistors 121, 122 can be configured to sample $V_{DD}$ and $V_{SS}$ on the first and second capacitors 124, 125, respectively, and the third transistor 123 can be configured to dump the charge on the differential amplifier 111 and feedback circuits 112, 113. Further, as used herein, $V_{DD}$ and, in certain examples, $V_{SS}$, can refer to scaled representations of $V_{DD}$ or $V_{SS}$ (e.g., using a voltage divider, capacitor and switch, etc.).

Figure 4:
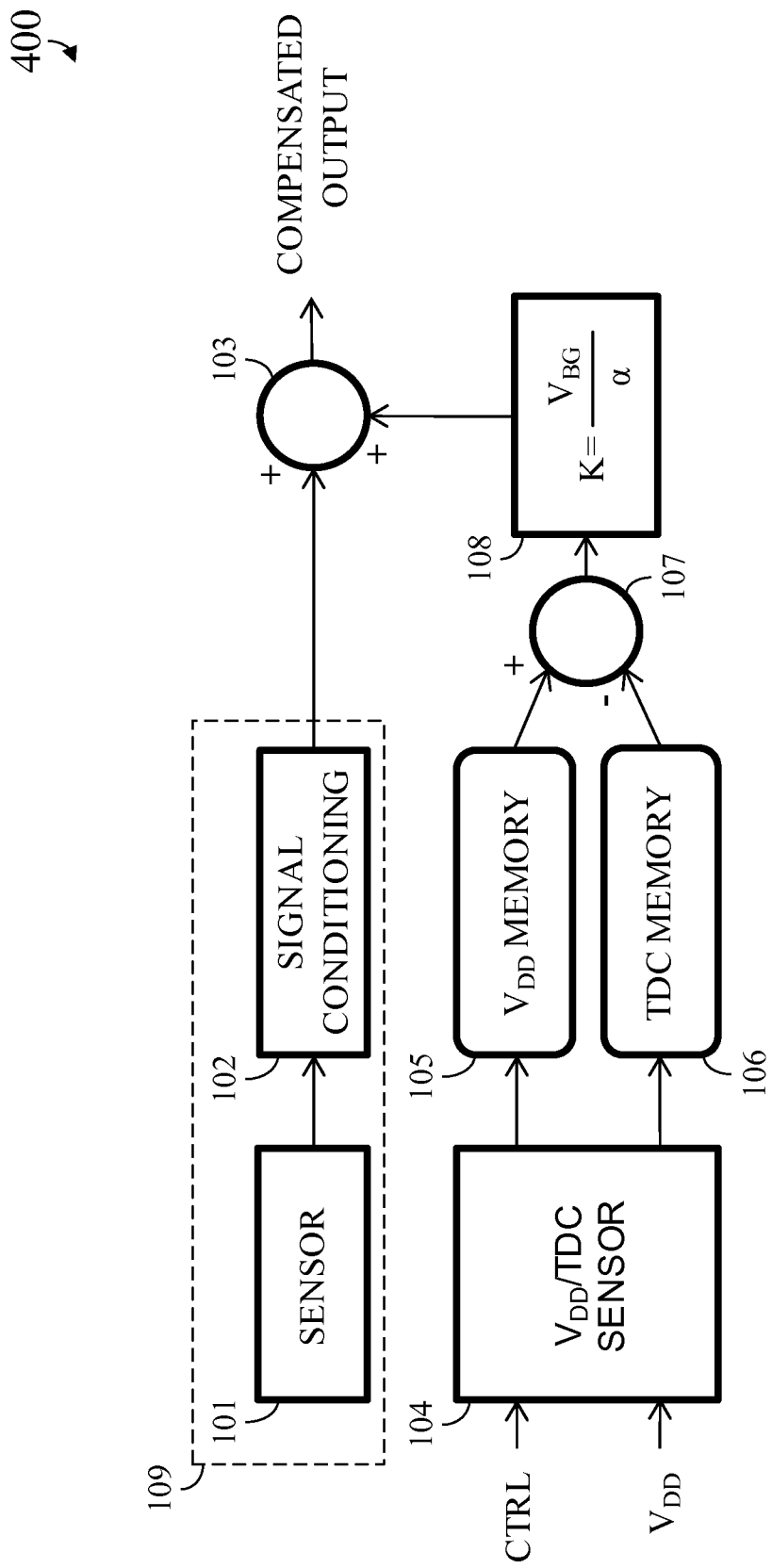
FIG. 4 illustrates generally an example diagram including a voltage and temperature sensor configured to compensate an output of a sensor (e.g., a MEMS sensor) output.

FIG. 4 illustrates generally an example diagram 400 including a voltage and temperature sensor 104 configured to compensate an output of a sensor 101 (e.g., a MEMS sensor) output. In an example, an existing sensor system 109 includes the sensor 101 and a signal conditioning circuit 102. In existing systems, the output of the signal conditioning circuit 102 is used. Other existing systems include a temperature sensor configured to adjust the output of the sensor 101 to correct for changes in the output due to temperature. However, the example of FIG. 4 further includes a voltage and temperature sensor 104 configured to separately detect supply voltage information using $V_{DD}$ (or a representation of $V_{DD}$) at a first time and temperature information using $V_{BE}$ at a second time. Timing of the detection can be controlled, for example, using CTRL, which in certain examples can include a simple clock signal or, in other examples, a more sophisticated custom control, depending on desired output or performance.

The example diagram 400 further includes an example supply memory ($V_{DD}$MEMORY) 105 and an example temperature memory (TDCMEMORY) 106. Memory circuits 105, 106 can include, for example, simple memory circuits such as a switch and capacitor, a transistor, a flip-flop, or one or more other simple circuits, or more complex memory circuits such as a register, a flip-flop, a non-transitory computer-readable storage media, etc.

In an example, a difference between the voltage information and temperature information can be taken at a difference circuit 107, and a correction factor can be calculated using the bandgap voltage and a scale factor α (e.g., a scale factor representing the reduction from $V_{DD}$ to the representation of $V_{DD}$, etc.) at calculation circuit 108. Further, the output of the signal conditioning circuit 102 can be adjusted using the output of the calculation circuit 108 at summation circuit 103 to provide a compensated output.

In other examples, one or more other calculations can be made. For example, the operations of the difference circuit 107 can be swapped, the difference circuit 107 can instead include a summation circuit or one or more other circuits, the calculation circuit 108 can be configured to perform one or more other operations, or the summation circuit 103 can include a difference or one or more other circuits.

In certain examples, the summation circuits 103 can be omitted entirely, and the output of the calculation circuit 108 can be provided to the signal conditioning circuit 102. In other examples, the outputs of one or more of the voltage and temperature sensor 104, the memory circuits 105, 106, the difference circuit 107, or the calculation circuit 108 can be provided to the signal conditioning circuit 102 to provide a compensated output, such as by altering a scale or offset in a first order linear correction or one or more second- or higher-order correction components.

An example implementation of the circuits illustrated, including digitally building the bandgap voltage using an existing TDC, for example, as follows:

Assuming $m_{temp}$ is the average sigma-delta (SD) output of a temperature sensor (from 0 to 1), such as that illustrated in FIG. 1, we can provide the following:

$$(1-m_{temp})10\Delta V_{BE} = m_{temp}V_{BE} \quad \text{(Eq. 1)}$$

where, $V_{BG} = 10\Delta V_{BE}$. Therefore:

$$m_{temp} = \frac{10\Delta V_{BE}}{(V_{BE} + 10\Delta V_{BE})} = \frac{10\Delta V_{BE}}{V_{BG}}. \quad \text{(Eq. 2)}$$

If we add variable Y to the (1−m) measurement and Z to the m measurement, where Y and Z are $\alpha V_{DD}$ and $-\alpha V_{DD}$, respectively, the equations become:

$$(1-m)(Y + 10\Delta V_{BE}) = m(Z + V_{BE}) \quad \text{(Eq. 3)}$$

$$m = \frac{(Y + 10\Delta V_{BE})}{(Y + Z + V_{BG})} \quad \text{(Eq. 4)}$$

$$m_{V_{DD}} = \frac{(\alpha V_{DD}) + (10\Delta V_{BE})}{V_{BG}}. \quad \text{(Eq. 5)}$$

Therefore, all that is required to implement supply voltage correction in digital with reference to $V_{BG}$ is:

$$\frac{(m_{V_{DD}} - m_{temp})V_{BG}}{\alpha} = V_{DD} \quad \text{(Eq. 6)}$$

Additional Notes and Examples

A system or apparatus can include, or can optionally be combined with any portion or combination of any portions of any one or more of the examples or illustrations above to include, means for performing any one or more of the functions described above, or a machine-readable medium including instructions that, when performed by a machine, cause the machine to perform any one or more of the functions described above.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A temperature and power supply sensitivity calibration system, comprising:
    a differential amplifier having a first input configured to receive a first base-emitter voltage ($V_{BE}$), a second input configured to receive a second base-emitter voltage, and an output configured to provide temperature information using the first and second base-emitter voltages; and
    a voltage conditioning circuit configured to sample representations of a positive and negative supply voltages and selectively provide the positive supply voltage sample to the first input of the differential amplifier and the negative supply voltage sample to the second input of the differential amplifier,
    wherein the second base-emitter voltage is a scaled representation of the first base-emitter voltage, and
    wherein the temperature and power supply sensitivity calibration system is configured to provide temperature and supply voltage information using the first and second base-emitter voltages and the representations of the positive and negative supply voltages.

2. The system of claim 1, including a microelectromechanical system (MEMS) sensor,
    wherein the power supply sensitivity calibration system is configured to correct for temperature and supply voltage variation in the MEMS sensor using the temperature and supply voltage information.

3. The system of claim 1, wherein the voltage conditioning circuit is configured to sample representations of the positive and negative supply voltages at a first time and provide the positive and negative supply voltage samples to the first and second inputs of the differential amplifier at a second time.

4. The system of claim 3, wherein the differential amplifier receives the first and second base-emitter voltages during both the first and second times.

5. The system of claim 1, wherein the voltage conditioning circuit includes:
a first transistor configured to selectively couple the representation of the positive supply voltage to a first capacitor; and
a second transistor configured to selectively couple the representation of the negative supply voltage to a second capacitor.

6. The system of claim 5, wherein the voltage conditioning circuit includes a third transistor configured to selectively provide charge from the first and second capacitors to the first and second inputs of the differential amplifier.

7. The system of claim 1, including a temperature-to-digital circuit (TDC) configured to receive the first and second base-emitter voltages and to provide digital temperature information using the first and second base-emitter voltages.

8. The system of claim 1, wherein the system includes an output conditioning circuit including an analog-to-digital converter (ADC),
wherein the output conditioning circuit is configured to receive the output of the differential amplifier, to store temperature information in a first memory circuit and supply voltage information in a second memory circuit, and to provide a digital correction signal using the stored temperature and supply voltage information.

9. The system of claim 1, including a microelectromechanical system (MEMS) sensor,
wherein the output conditioning circuit is configured to correct for temperature and supply voltage variation in the MEMS sensor using the temperature and supply voltage information.

10. The system of claim 9, wherein the output conditioning circuit is configured to subtract the temperature information from the supply voltage information and add the resulting output to the MEMS sensor information.

11. A power supply sensitivity calibration method, comprising:
receiving a first base-emitter voltage ($V_{BE}$) at a first input of a differential amplifier and a second base-emitter voltage at a second input of a differential amplifier;
providing temperature information using a difference between the first and second base-emitter voltages; and
sampling representations of positive and negative supply voltages using a voltage conditioning circuit;
selectively providing the positive supply voltage sample to the first input of the differential amplifier and the negative supply voltage sample to the second input of the differential amplifier using the voltage conditioning circuit;
providing temperature and supply voltage information using the first and second base-emitter voltages and the representations of the positive and negative supply voltages,
wherein the second base-emitter voltage is a scaled representation of the first base-emitter voltage.

12. The method of claim 11, including correcting for temperature and supply voltage variation in a microelectromechanical system (MEMS) sensor using the temperature and supply voltage information.

13. The method of claim 11, wherein the sampling representations of the positive and negative supply voltages includes sampling representations of the positive and negative supply voltages at a first time, and
wherein the selectively providing the positive and negative supply voltage samples to the first and second inputs of the differential amplifier includes providing the positive and negative supply voltage samples to the first and second inputs of the differential amplifier at a second time.

14. The method of claim 13, wherein the receiving the first and second base-emitter voltages includes receiving the first and second base-emitter voltages during both the first and second times.

15. The method of claim 11, wherein the sampling the representations of the positive and negative supply voltages includes:
selectively coupling the representation of the positive supply voltage to a first capacitor using a first transistor; and
selectively coupling the representation of the negative supply voltage to a second capacitor using a second transistor.

16. The method of claim 15, wherein the selectively providing the positive and negative supply voltages samples to the differential amplifier includes selectively provide charge from the first and second capacitors to the first and second inputs of the differential amplifier using a third transistor.

17. The method of claim 11, including providing digital temperature information using a temperature-to-digital circuit (TDC) and the first and second base-emitter voltages.

18. The method of claim 11, including:
receiving output from the differential amplifier at an output conditioning circuit;
storing temperature information in a first memory circuit and supply voltage information in a second memory circuit; and
providing a digital correction signal using the stored temperature and supply voltage information.

19. The method of claim 11, including:
correcting for temperature and supply voltage variation in a microelectromechanical system (MEMS) sensor using the temperature and supply voltage information.

20. The method of claim 19, including:
subtracting the temperature information from the supply voltage information; and
adding the resulting output to the MEMS sensor information.

* * * * *